United States Patent
Ran

(10) Patent No.: US 9,281,970 B2
(45) Date of Patent: Mar. 8, 2016

(54) ERROR BURST DETECTION FOR ASSESSING RELIABILITY OF A COMMUNICATION LINK

(71) Applicant: Intel Corporation, Santa Clara, CA (US)

(72) Inventor: Adee O. Ran, Maayan Baruch (IL)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 14/180,761

(22) Filed: Feb. 14, 2014

(65) Prior Publication Data

US 2015/0106668 A1 Apr. 16, 2015

Related U.S. Application Data

(60) Provisional application No. 61/889,945, filed on Oct. 11, 2013.

(51) Int. Cl.
| | |
|---|---|
| *H04L 25/03* | (2006.01) |
| *H03M 13/09* | (2006.01) |
| *H04L 12/26* | (2006.01) |
| *H04L 1/00* | (2006.01) |

(52) U.S. Cl.
CPC ......... *H04L 25/03057* (2013.01); *H03M 13/09* (2013.01); *H04L 1/00* (2013.01); *H04L 43/0847* (2013.01)

(58) Field of Classification Search
CPC ............... H04L 43/0847; H04L 25/03057; G06F 11/10; H03M 13/09

USPC .......................................................... 714/776
See application file for complete search history.

(56) References Cited

U.S. PATENT DOCUMENTS

| | | | | |
|---|---|---|---|---|
| 8,370,704 | B2* | 2/2013 | Ganga et al. ................... | 714/757 |
| 8,473,820 | B2* | 6/2013 | Shin et al. ...................... | 714/776 |
| 2009/0129504 | A1* | 5/2009 | Lee et al. ....................... | 375/316 |
| 2010/0281343 | A1* | 11/2010 | Caggioni et al. .............. | 714/776 |

OTHER PUBLICATIONS

Hossain, E.; Bhargava, V.K., "Link-level traffic scheduling for providing predictive QoS in wireless multimedia networks," Multimedia, IEEE Transactions on, vol. 6, No. 1, pp. 199,217, Feb. 2004.*
Part 3: Carrier Sense Multiple Access With Collision Detect on (CSMA/CD) Access Method and Physical Layer Specifications, IEEE Std 802.3, 2000 Edition, vol., No., pp. i,1515, 2000.*

* cited by examiner

*Primary Examiner* — Cynthia Britt
(74) *Attorney, Agent, or Firm* — Law Office of R. Alan Burnett, P.S

(57) ABSTRACT

Methods, apparatus, and systems for preventing false packet acceptance in high-speed links. In accordance with one aspect, embodiments are disclosed that facilitate assessing the probability of error bursts in receivers that include decision feedback equalizers (DFEs) and that perform non-contiguous mapping of received bits to frame bits. From this probability, calculation of a mean-time to false packet acceptance (MTTFPA) may be determined, and indication that a projected link MTTFPA is too low can be used to trigger an alert or invoke some safety mechanism. Associated operations may then be performed to ensure the link is prevented from being operated in an unsafe condition under which false packet acceptance may occur.

29 Claims, 13 Drawing Sheets

Figure 88-1—100GBASE-LR4 and 100GBASE-ER4 PMDs relationship to the ISO/IEC Open Systems Interconnection (OSI) reference model and IEEE 802.3 CSMA/CD LAN model Figure 82-6—PCS Block distribution Figure 83-3—PMA bit mux used in both Tx and Rx directions Figure 88-2—Block diagram for 100GBASE-LR4 and 100GBASE-ER4 transmit/receive paths Figure 82-7—Alignment marker insertion Figure 82-8—Alignment marker insertion period Figure 82-9—Alignment marker format Table 82-2—100GBASE-R Alignment marker encodings

| PCS lane number | Encoding* {M0, M1, M2, BIP3, M4, M5, M6, BIP7} | PCS lane number | Encoding* {M0, M1, M2, BIP3, M4, M5, M6, BIP7} |
|---|---|---|---|
| 0 | 0xC1, 0x68, 0x21, BIP3, 0x3E, 0x97, 0xDE, BIP7 | 10 | 0xFD, 0x6C, 0x99, BIP3, 0x02, 0x93, 0x66, BIP7 |
| 1 | 0x9D, 0x71, 0x8E, BIP3, 0x62, 0x8E, 0x71, BIP7 | 11 | 0xB9, 0x91, 0x55, BIP3, 0x46, 0x6E, 0xAA, BIP7 |
| 2 | 0x59, 0x4B, 0xE8, BIP3, 0xA6, 0xB4, 0x17, BIP7 | 12 | 0x5C, 0xB9, 0xB2, BIP3, 0xA3, 0x46, 0x4D, BIP7 |
| 3 | 0x4D, 0x95, 0x7B, BIP3, 0xB2, 0x6A, 0x84, BIP7 | 13 | 0x1A, 0xF8, 0xBD, BIP3, 0xE5, 0x07, 0x42, BIP7 |
| 4 | 0xF5, 0x07, 0x09, BIP3, 0x0A, 0xF8, 0xF6, BIP7 | 14 | 0x83, 0xC7, 0xCA, BIP3, 0x7C, 0x38, 0x35, BIP7 |
| 5 | 0xDD, 0x14, 0xC2, BIP3, 0x22, 0xEB, 0x3D, BIP7 | 15 | 0x35, 0x36, 0xCD, BIP3, 0xCA, 0xC9, 0x32, BIP7 |
| 6 | 0x9A, 0x4A, 0x26, BIP3, 0x65, 0xB5, 0xD9, BIP7 | 16 | 0xC4, 0x31, 0x4C, BIP3, 0x3B, 0xCE, 0xB3, BIP7 |
| 7 | 0x7B, 0x45, 0x66, BIP3, 0x84, 0xBA, 0x99, BIP7 | 17 | 0xAD, 0xD6, 0xB7, BIP3, 0x52, 0x29, 0x48, BIP7 |
| 8 | 0xA0, 0x24, 0x76, BIP3, 0x5F, 0xDB, 0x89, BIP7 | 18 | 0x3F, 0x66, 0x2A, BIP3, 0xA0, 0x99, 0xD5, BIP7 |
| 9 | 0x68, 0xC9, 0xFB, BIP3, 0x97, 0x36, 0x04, BIP7 | 19 | 0xC0, 0xF0, 0xE5, BIP3, 0x3F, 0x0F, 0x1A, BIP7 |

*Each octet is transmitted LSB to MSB.

*Fig. 8a* (prior art)

Table 82-4—BIP3 bit assignments

| BIP3 bit number | Assigned 66-bit word bits |
|---|---|
| 0 | 2, 10, 18, 26, 34, 42, 50, 58 |
| 1 | 3, 11, 19, 27, 35, 43, 51, 59 |
| 2 | 4, 12, 20, 28, 36, 44, 52, 60 |
| 3 | 0, 5, 13, 21, 29, 37, 45, 53, 61 |
| 4 | 1, 6, 14, 22, 30, 38, 46, 54, 62 |
| 5 | 7, 15, 23, 31, 39, 47, 55, 63 |
| 6 | 8, 16, 24, 32, 40, 48, 56, 64 |
| 7 | 9, 17, 25, 33, 41, 49, 57, 65 |

*Fig. 8b* (prior art)

Figure 82–13—BER monitor state diagram

Figure 83D-1—CAUI-4 relationship to the ISO/IEC Open System Interconnection reference model and the IEEE 802.3 CSMA/CD LAN model

ERROR BURST DETECTION FOR ASSESSING RELIABILITY OF A COMMUNICATION LINK

CROSS-REFERENCE TO RELATED APPLICATION

This application claims the benefit of the filing date of U.S. Provisional Application No. 61/889,945, filed Oct. 11, 2013, entitled "ERROR BURST DETECTION FOR ASSESSING RELIABILITY OF A COMMUNICATION LINK" under 35 U.S.C. §119(e). U.S. Provisional Application No. 61/889,945 is further incorporated herein in its entirety for all purposes.

BACKGROUND INFORMATION

An important feature of network communication is data integrity. Under Ethernet, for example, this is accomplished using a 32-bit Cyclic Redundancy Check (CRC32) field that is added to each Ethernet MAC (Media Access Control) frame. The CRC provides full protection against many types of errors, including up to 3 bit errors in a normal-size MAC frame and bursts of consecutive errors up to 32 bits long. Other combinations of errors may pass the CRC32 check with a small probability (up to $2^{-32}$ for random error distribution).

If multiple errors occur on an Ethernet link, the MAC frame could pass the CRC32 check; this event is called false packet acceptance, and ideally it should never occur. For example, the data for a MAC frame could be received with multiple errors that by random chance produce the same CRC32 value as a MAC frame with no errors. In practice, communication errors can't be totally prevented; the desire is that false packet acceptance would be so rare that the time until one is expected to happen (mean time to false packet acceptance, or MTTFPA) is larger than the age of the universe (AOU—about 13 Billion years).

Several physical layer (PHY) types for Ethernet over backplanes, Optics, and copper cables, at 10 Gb/s data rates and above are defined in various clauses of the IEEE 802.3 standard. The bit error ratio (BER) required for these PHYs is typically 1e−12. With this BER, if errors are uncorrelated to each other, the probability that enough errors occur to prevent CRC32 from detecting them is low enough to ensure MTTFPA>AOU. If errors occur at a much higher rate (BER>>1e−12), then MTTFPA may not be as large as desired. Assuming the errors typically generated by the physical layer receiver are independent, the probability of having more than 3 errors in a frame is governed by a $BER^4$ term, and is thus extremely small, guaranteeing the required MTTFPA. Accordingly, specifying very low BER can be seen as a solution to false packet acceptance.

One of the usual components in high-speed receivers is the decision feedback equalizer (DFE). A DFE is helpful in reducing the probability of individual errors, but can introduce error propagation: once a bit is incorrectly decoded (a bit error occurs), it is more likely that the next bit will also be incorrectly decoded (the error will propagate). The probability of error propagation depends on the noise statistics and the DFE configuration; it can range between 0 (in the no-DFE case) to 0.5 (very strong DFE case). Therefore, the probability of bursts of 4 or more errors may be considerably higher than $BER^4$.

As long as the bits received on the physical medium are mapped to contiguous bits in a frame (as done in 10GBASE-KR), the capability of the CRC to detect a single burst of any length guards against false packet acceptance. However, newer encoding schemes require striping data bits across several lanes, and un-striping the physical lane bits back at the receiver. As a result, physical lane bits are mapped to frame bits in a non-contiguous way, and a burst is converted into a series of non-adjacent errors, against which the CRC does not protect perfectly. Statistical calculations show that with bit-muxing, error bursts may degrade MTTFPA to intolerable periods (thousands of years) unless they have sufficiently low probability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 8a is a table illustrating alignment marker encodings for a 100GBASE-R PCS;

FIG. 8b is a table illustrating assigned 66-word bits for the $BIP_3$ bit numbers;

DETAILED DESCRIPTION

Figure 1:
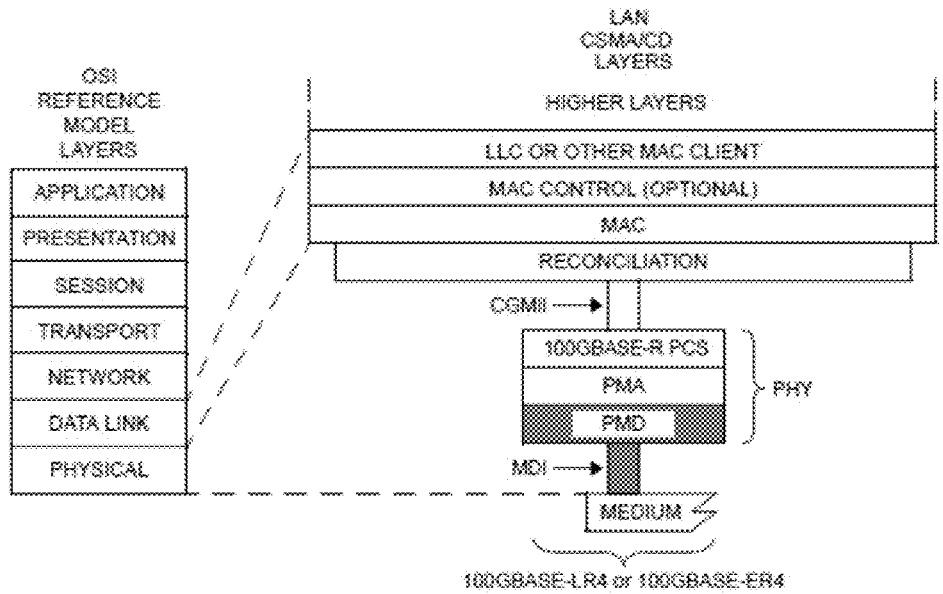
FIG. 1 is diagram illustrating the relationship of the Data Link and Physical layers of the 100GBASE-LR4 and 100GBASE-ER4 PMDs relative to the ISO/IEC Open System Interconnection reference model and the IEEE 802.3 LAN CSMA/CD LAN model.

Embodiments of methods, apparatus, and systems for preventing false packet acceptance in high-speed links are described herein. In the following description, numerous specific details are set forth (such as example embodiments relating to proposed IEEE 100 Gb/s Ethernet links) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of apparatus and methods for preventing false packet acceptance in Ethernet communication are described herein. By way of example and without limitation, some embodiments are presented herein pertaining to proposed 100Gb/s Ethernet links, such as the proposed 100GBASE-LR4, 100GBASE-ER4, and 100GBASE-SR4 links. In addition to aspects of these links described herein, other aspects of some embodiments are described in further detail in IEEE draft standard P802.3bm (current draft 1.2), IEEE draft standard P802.3bj (current draft 2.2), as well as other IEEE 802.3 specifications and standards (e.g., various sections of IEEE 802.3-2012 standards).

In accordance with one aspect, embodiments or disclosed that facilitate assessing the probability of error bursts in receivers that include a DFE and that perform non-contiguous mapping of received bits to frame bits. From this probability, calculation of the MTTFPA is straightforward; indication that MTTFPA is too low can be used to trigger an alert or invoke some safety mechanism. Associated operations may then be performed to ensure the link is prevented from being operated in an unsafe condition under which false packet acceptance may occur.

An example of a case where received bits are mapped to frame bits in a non-contiguous way is the transcoding operation defined in the RS-FEC (Reed Solomon-Forward Error Correction) sublayer for 100GBASE-R PHYs of recently proposed 100 Gb/s Ethernet links, as defined in Clause 91, P802.3bj draft amendment to the IEEE 802.3-2012 Standard. In this case, the transmitter maps groups of 10 bits on each of four physical lanes in a round-robin manner. The receiver does the inverse mapping, collecting bits from the four lanes to recover the original bit stream. A burst of errors that spans two groups of 10 bits may create two or more non-adjacent errors. However, due to the strong error detection capability of the RS-FEC sublayer, such errors are almost always detected and are either corrected or marked in a way that prevents false packet acceptance, so MTTFPA is generally not a concern.

Another example of a link for which received bits are mapped to frame bits in a non-contiguous manner is the 100GBASE-LR4 and 100GBASE-ER4 PHY defined in clause 88 of IEEE 802.3-2012. However, in contrast to the foregoing links, the 100GBASE-LR4/ER4 PHY does not employ RS-FEC protection. Rather, the 100GBASE-LR4 PHY uses the 100GBASE-R Physical Coding Sublayer (PCS) defined in clause 82, and the Physical Medium Attachment (PMA) sublayer, defined in clause 83, as shown in FIG. 1.

Figure 2:
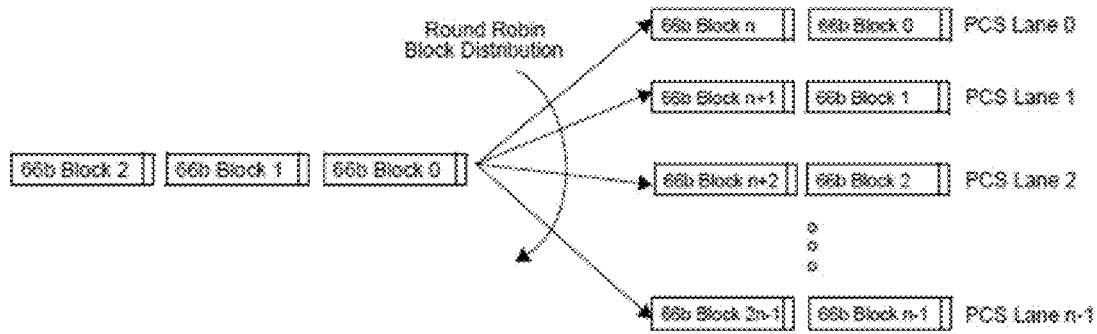
FIG. 2 is a diagram illustrating a Physical Coding Sublayer (PCS) Block distribution scheme, according to one embodiment.
Figure 3:
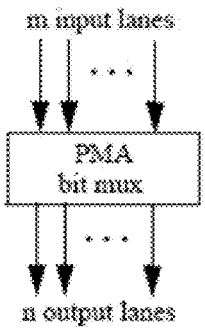
FIG. 3 is diagram illustrating a PMA bit multiplexer use for both transmit and receive directions.

The 100GBASE-R PCS encodes each MAC frame into a stream of 66-bit blocks and distributes them to 20 data streams (virtual lanes), each containing 5 Gb/s, using a block distribution scheme. Distribution is as shown in FIG. 2, to multiple (n) PCS lanes (n=20 for 100GBASE-R PCS). The PCS lanes are virtual lanes, and in the 100GBASE-LR4/ER4 PHY, the PMA multiplexes the 20 virtual PCS lanes into four physical lanes in the transmit direction (bit-by-bit), and the physical lane bits are transmitted over an optical medium (using optical wavelength multiplexing). The receiver de-multiplexes the optical signal to four physical lanes, recovers the bits from each physical lane, and de-multiplexes them back to 20 virtual lanes. Both mux/demux operations are done in a bitwise manner. This is schematically illustrated in FIGS. 3 and 4.

All PMA variants for 100GBASE-R signals are based on a generic specification of a bit mux function that applies to all input/output lane counts and each direction of transmission. Each direction of transmission employs one or more such bit muxes to adapt from the appropriate number of input lanes to the appropriate number of output lanes as illustrated in FIG. 3. Since 100GBASE-LR4 uses four optical paths, at the transmitter side, m=20 input (virtual) lanes are multiplexed onto n=4 output (physical lanes), and at the receiver side, m=4 input (physical) lanes are multiplexed onto n=20 output (virtual) lanes.

Figure 4:
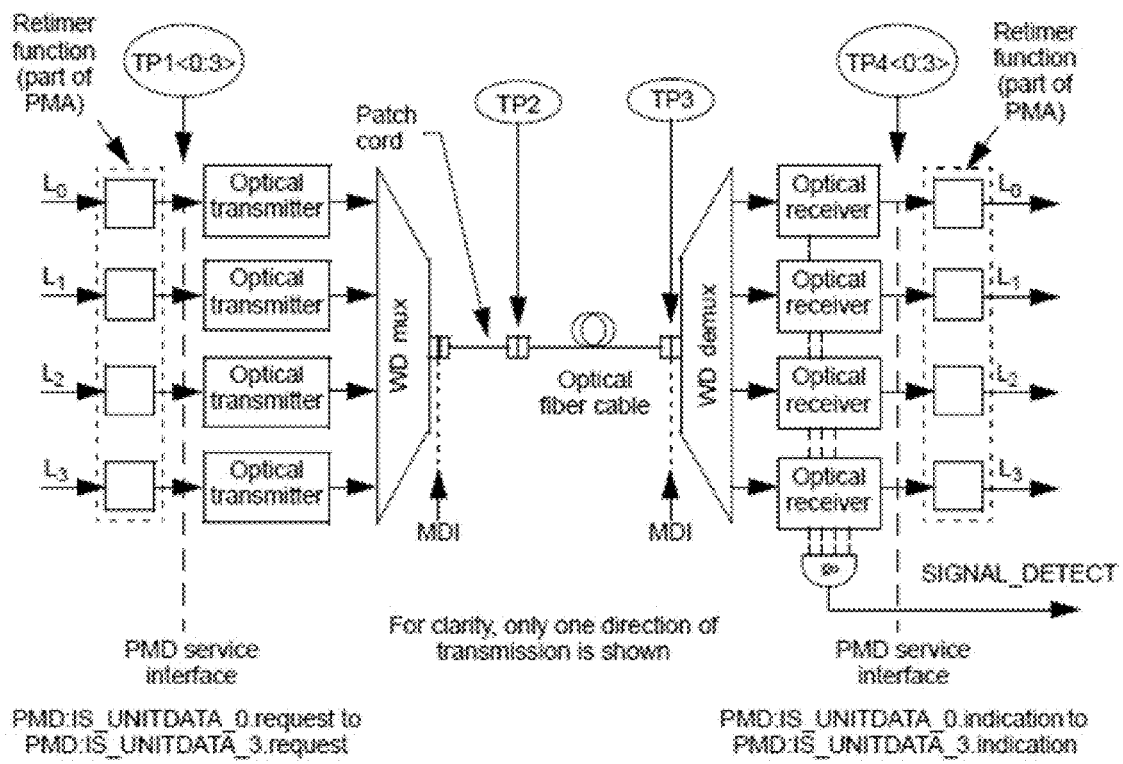
FIG. 4 is a block diagram illustrating transmit and receive paths for 100GBASE-LR4 and 100GBASE-ER4 links.

As shown in FIG. 4, for the 100GBASE-LR4 and 100GBASE-ER4 transmit and receive paths there are four physical lanes $L_0$, $L_1$, $L_2$, and $L_3$ that carry signals that are multiplexed using wavelength division and transmitted over an optical fiber cable. At the receive side, the wavelength division optical signal is de-multiplexed with a wavelength division demux, and further processing of the signal is handled by an optical receiver for each lane.

As a result of the PCS and PMA operations, adjacent bits received on one physical lane are mapped to different virtual lanes and appear in non-adjacent positions in the MAC frame. This gives rise to an MTTFPA concern if a DFE is used in the receiver, since a single burst of four errors in one physical lane can create four non-adjacent errors in the MAC frame, which is not guaranteed to be detected by the MAC CRC. Current implementations of 100GBASE-LR4 avoid MTTFPA concerns by not using a DFE in the receiver (making error bursts unlikely to occur). This is sufficient for optical-only links which need very little equalization, if any.

The P802.3bm task force is currently working on definition of a physical instantiation of the 4-lane 100GB/s Attachment Unit Interface (CAUI-4) for chip-to-module and chip-to-chip connections, using four 25 Gbaud lanes over an electrical channel (e.g., a printed circuit board (PCB)). CAUI-4 is defined to operate at a BER of up to 1e−15. To achieve this performance with a highly dispersive electrical connection between receiver and transmitter, equalization using a DFE may be necessary, and indeed it is proposed to define the reference receiver to include a 5-tap DFE, in order to allow electrical connection with up to 20 dB insertion loss.

CAUI-4 can be used to connect between the PMA and PMD sublayers of a 100GBASE-LR4 PHY. Since 100GBASE-LR4 uses bit multiplexing and no error correction, using a DFE can create an MTTFPA concern even in links with BER<1e−15. Statistical calculations show that to achieve MTTFPA>13e9 years given BER<1e−15, the probability of error propagation should be lower than 0.03. This may or may not be feasible depending on the particular system under hand. For example, a loosely inserted connector or a bad-performing chip may cause a strong DFE configuration which will have a higher probability of error propagation.

Verifying that a receiver meets this error propagation probability requirement is not practical; just a direct verification of BER<1e−15 on a single lane with reasonable statistical significance requires transmitting and receiving at least 3e15 bits, which takes several hours. Verification of having a probability lower than 0.03*1e−15=3e−17 for a single-error-propagation event requires about 1e17 bits per lane, which takes more than 11 days. In some cases, shortened tests are performed by artificially injecting noise into the received signal and thus increasing the probability of uncorrelated errors; however, this method may not fully predict the required performance, and further requires specialized test environments and cannot be done in deployed systems.

As a result of the foregoing, verifying that a given system employing the multi-lane link configuration above is "safe" in terms MTTFPA is currently unfeasible. Without such verification, a deployed system may have very short MTTFPA (in the order of days) without any indication to a user or an operator of that condition.

Figure 5:
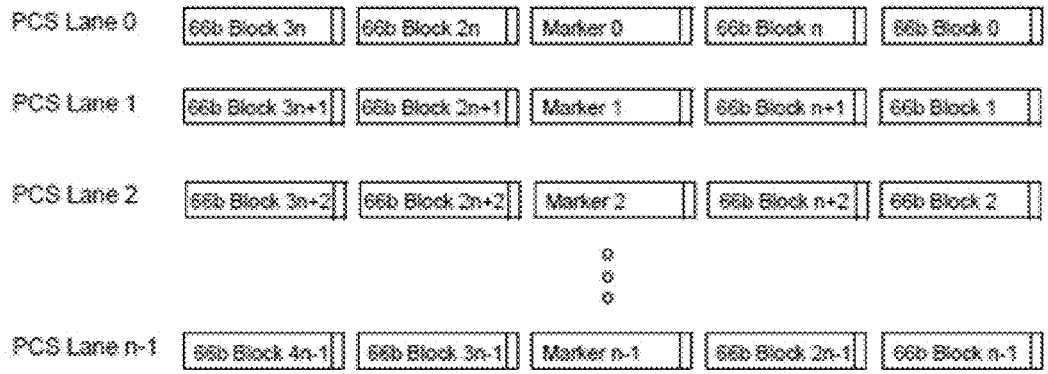
FIG. 5 is a diagram illustrating alignment marker insertion used by the PCS sublayer of 100GBASE-R links.
Figure 6:
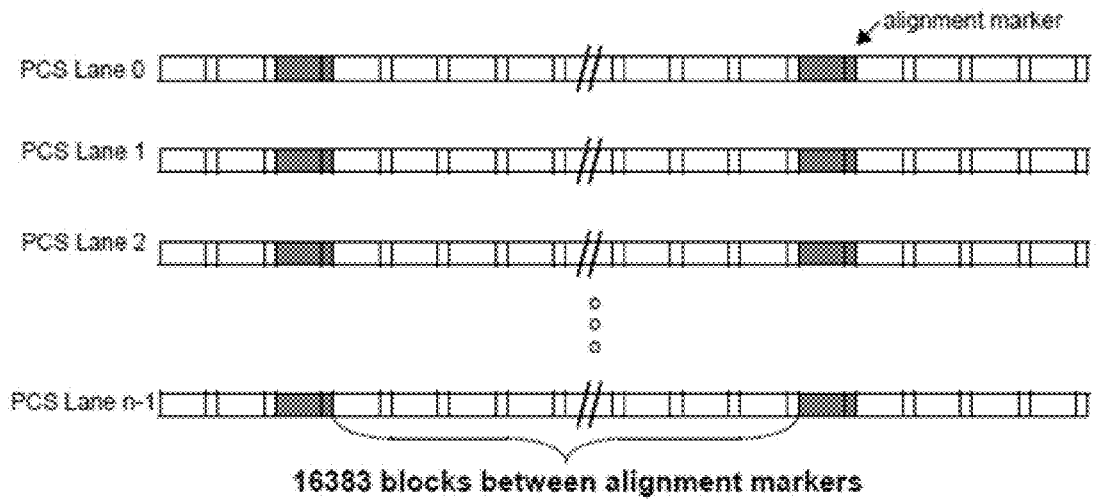
FIG. 6 is a diagram illustrating an alignment marker insertion period, according to one embodiment.
Figure 7:
FIG. 7 is a diagram illustrating an alignment marker format, according to one embodiment.

In accordance with aspects of the embodiments now described, this problem is addressed by detecting non-adjacent errors across multiple lanes and using the occurrence of such errors to detect burst error conditions, enabling the frequency of burst errors and the probability of error propagation to be estimated. In one embodiment, the approach uses the existing bit-interleaved parity (BIP) fields that are present in the 100GBASE-R PCS alignment markers. The PCS alignment markers are 66-bit blocks that are inserted periodically to each of the PCS (virtual) lanes by the transmit-side PCS. The PCS deskew process at the receiver is responsible for detecting alignment markers in each lane, decoding them and replacing them with IDLE. The process of alignment marker insertion and their structure are shown in FIGS. 5-7.

In further detail, in order to support deskew and reordering of individual PCS lanes at the receive PCS, alignment markers are added periodically (e.g., after every 16383 66-bit blocks) to each PCS lane by the transmit-side PCS. The alignment marker has the form of a specially defined 66-bit block with a control block sync header. These markers interrupt any data transfer that is already in progress. This allows alignment markers to be inserted into all PCS lanes at the same time. The alignment markers are not scrambled and are added after encoding is performed in the transmit PCS and the alignment markers are removed before 64B/66B decoding is performed in the receive PCS. The alignment markers are not scrambled in order to allow the receiver to find the alignment markers, deskew the PCS lanes, and reassemble the aggregate stream before descrambling is performed.

The content of the alignment markers for 100GBASE-R is shown in FIG. 8*a*. The contents depend on the PCS lane number and the octet number. Note that M4 through M6 are the bit-wise inversion of M0 through M2, respectively. Also BIP$_7$ is the bit-wise inversion of BIP$_3$. This property allows the alignment markers to be DC balanced. Lane markers 0 to 19 in FIG. 8*a* are used for the 100GBASE-R PCS. As an example, the lane marker for 100GBASE-R lane number 0 is sent as (left most bit sent first):

10 10000011 00010110 10000100 BIP3 01111100 11101001 01111011 BIP7

After the alignment markers are inserted, data is sent to the PMA or FEC sublayer adjacent to the PCS.

A PCS lane BIP field is carried in each PCS Lane alignment marker. This information is used to update error counters and allows an accurate and fast measure of the bit error ratio of a given PCS Lane. Each alignment marker has two Bit Interleaved Parity fields, BIP$_3$ and BIP$_7$; BIP$_7$ is a bit-wise inversion of BIP$_3$ in order to keep the alignment marker DC balanced. The BIP$_3$ field contains the result of a bit interleaved parity calculation. Each bit in the BIP field is an even parity calculation over all of the previous specified bits of a given PCS Lane, from and including the previous alignment marker, but not including the current alignment marker. Using the bit definitions as shown in FIG. 7, table 800 of FIG. 8*b* shows the bit assignments for each BIP$_3$ bit. As an example, BIP$_3$ bit 0 contains the result of XORing 131072 bits from 16384 66-bit words. BIP$_3$ bit 3 and bit 4 also include one sync header bit from each 66-bit word. Bit 3 and bit 4 each contain the result of XORing 147456 bits.

The BIP fields are calculated by the PCS at the transmitter side and sent to the receiver; the PCS on the receiver side can perform a similar calculation on the received data and compare the resulting re-calculated BIP to the received BIP in the transmitted data. Note that any single error in the 16384 blocks will cause a single bit to flip in the re-calculated BIP (one-bit mismatch). Two bit errors on the same virtual lane with certain distances apart may cancel each other (the smallest distance is 5 in some cases) but otherwise they will cause two bit flips in the same BIP field.

The existing PCS specification defines that BIP mismatches should be counted in per-lane registers (see subclauses 82.2.14 and 45.2.3.44). This enables estimation of the BER by dividing the BIP block error ratio by 1081344. However, it does not enable differentiating between uncorrelated errors and burst errors, so the frequency of burst errors and the probability of error propagation cannot be estimated. Embodiments disclosed herein add the capability to monitor burst frequency separately.

Figure 9:
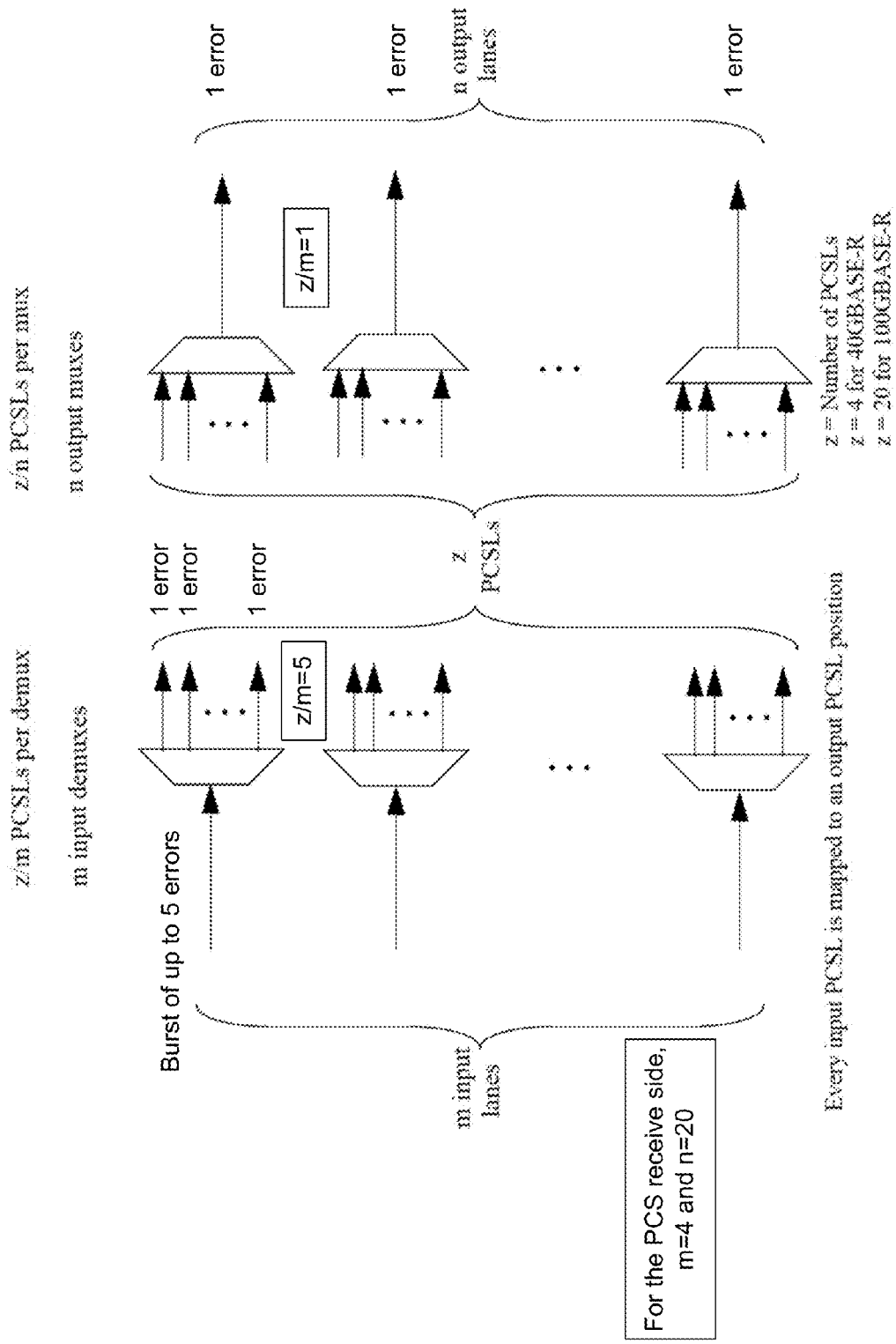
FIG. 9 is diagram illustrating PMA bit mux operations in transmitter and receiver operations for a link that multiplexes data over multiple physical and virtual lanes.

An example of a 100GBASE-R PMA bit mux operation for Tx and Rx directions is shown in FIG. 9. The PMA service interface for 40GBASE-R and 100GBASE-R is an instance of the inter-sublayer service interface defined in 80.3. The PMA service interface primitives are summarized as follows:

PMA:IS_UNITDATA_i.request(tx_bit)
PMA:IS_UNITDATA_i.indication(rx_bit)
PMA:IS_SIGNAL.indication(SIGNAL_OK)

For a PMA with p lanes at the PMA service interface, the primitives are defined for i=0 to p−1.

If the PMA client is the PCS or an FEC sublayer, the PMA (or PMA client) continuously sends four (for 40GBASE-R) or twenty (for 100GBASE-R) parallel bit streams to the PMA client (or PMA), each at the nominal signaling rate of the PCSL (PCS Lane). If the PMA client is another PMA, for a PMA supporting a 40GBASE-R PMD, the number of PCSLs z=4 and for a PMA supporting a 100GBASE-R PMD, the number of PCSLs z=20. An illustration of the bit mux operations for Tx and Rx directions for a 100GBASE-R PMA employing m=4 physical lanes and 20 PCSLs (virtual lanes) is shown in FIG. 9. A PMA with p input lanes receives bits on each of its input lanes at z/p times the PCSL rate. Skew may exist between the bits received on each lane even though all lanes originate from the same synchronous source, so there is independence of arrival of bits on each lane.

In the Tx direction, if the bit from a PMA:IS_UNITDATA_i.request primitive is received over a physically instantiated interface (e.g., XLAUI/CAUI), clock and data are recovered on the lane receiving the bit. The bit is routed through the PMA to an output lane through a process that may demultiplex PCSLs from the input, perform any necessary buffering to tolerate Skew Variation across input lanes, and multiplex PCSLs to output lanes. The bit is sent on an output lane to the sublayer below using the inst:IS_UNIT-DATA_k.request (k not necessarily equal to i) primitive (see 83.4).

In the Rx direction, when data is being received from every input lane from the sublayer below the PMA that has a PCSL that is routed to a particular output lane at the PMA service interface, and (if necessary), buffers are filled to allow tolerating the Skew Variation that may appear between the input lanes, PCSLs are demultiplexed from the input lanes, remultiplexed to the output lanes, and bits are transferred over each output lane to the PMA client via the PMA:IS_UNIT-DATA_i.indication primitive.

At the receive side, the alignment markers are used for re-aligning and re-ordering the 20 PCSLs (virtual lanes) into a single stream, so the 20 markers are available together as a group when they arrive. The receiver may also know the PMA mapping—which virtual lanes are assigned to each physical lane and the multiplexing order. If this information is available, the receiver can judge whether two virtual lanes are physically-adjacent (adjacent on the same physical lane) or not.

Now consider an error burst event. When several (up to 5) adjacent errors appear on one physical lane, the multiplexing process will distribute the errors so that they appear on separate PCS (virtual) lanes, as a single error on each one. Assuming this is a rare event, no other errors are likely in the 16384 blocks between alignment markers on any of the 20 lanes, and none of the BIP bits will be flipped back. As a result, when the next group of alignment markers there will be BIP mismatches on several physically-adjacent PCS lanes.

According to aspects of some embodiments, an indication of errors on virtual lanes is periodically tracked and used to detect error burst events. The rate and/or length of the tracked burst errors may be used to inform a management entity of unsafe operating conditions and/or cause the link to be paused or restarted. Under one embodiment, a mechanism is implemented that leverages the foregoing BIP mismatch detection capability to identify unsafe link operating conditions. Under the mechanism and an associated method, an indication of errors on virtual lanes is periodically tracked using existing error detection and the BIP mismatch facilities, enabling the rate and length of burst errors to be measured during normal system operation.

In one exemplary implementation pertaining to a 100GBASE-R link, a test for BIP mismatches on at least 2 of the 20 PCS lanes is performed. Optionally, if the PMA mapping is known, the receiver PCS can also check that the errors occurred on physically-adjacent lanes. Whenever this condition is detected, the PCS increments an error burst counter. Separate counters are used for each burst length. In one embodiment, these counters are PCS global (rather than per-lane).

The PCS keeps track of errors using the BIP field in alignment markers (AMs) in each of its lanes. A BIP will detect any single bit error since the last AM. Assuming BER<1e15, having more than one burst on any lane between adjacent AMs is extremely unlikely. After PCS lane alignment, AMs from all 20 lanes are available together. When a burst of length L occurs, exactly L out of the 20 AMs will have BIP mismatch.

If the full link operates at BER=1e−12, then errors are expected once per 100 seconds. Each error will cause one of 20 BIP counters to advance. If one reads all 20 BIP counters once per second (noting that they are clear-on-read) then:

Reading all zeros means no error have occurred during this second;

Reading 1 on one counter means a single error has occurred;

Reading 1 on N counters (N≤5) means a single burst of N errors has occurred; and Reading anything else is extremely unlikely (or means a link-wide event)

Figure 10:
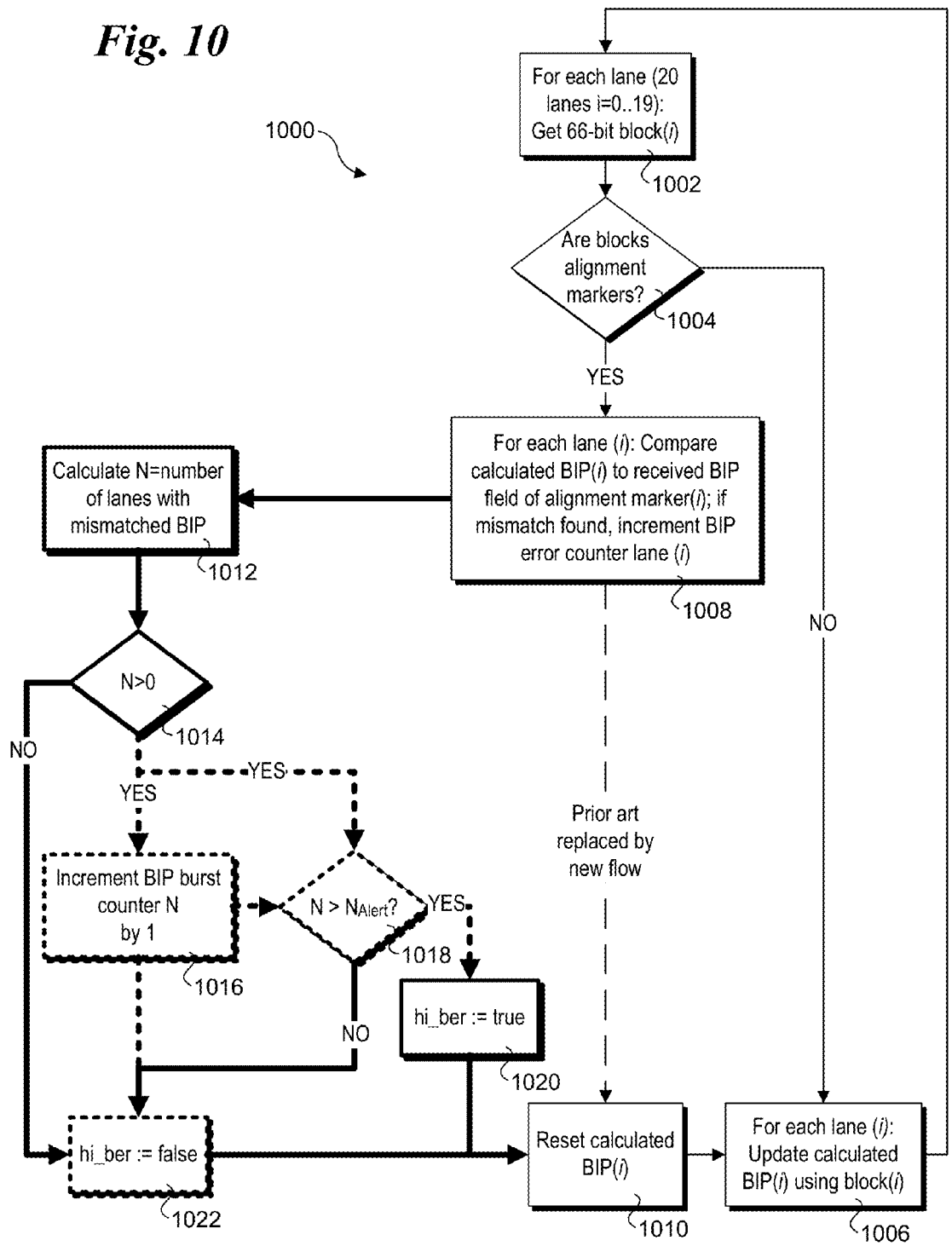
FIG. 10 is a flowchart illustrating operations and logic for detecting errant link conditions based on mismatched BIP values between lanes.

Operations and logic for implementing an embodiment of the mechanism are illustrated in a flowchart 1000 of FIG. 10. As shown, the mechanism is implemented via operation and logic blocks configured in a loop-wise manner. In addition, each of the blocks shown in thin outline are used in the conventional process, while the blocks shown in bold outline are new. In a block 1002, a 66-bit block(i) for each of 20 virtual lanes i is evaluated. In a decision block 1004 a determination is made to whether any of the blocks are alignment markers. If they are not alignment markers, the logic proceeds to a block 1006 in which an updated BIP(i) is calculated for each lane i using block(i). The logic then returns to block 1002 to evaluate the next set of 66-bit blocks for the 20 virtual lanes.

Returning to decision block 1004, if a block is an alignment marker the logic proceeds to a block 1008 in which a comparison is made between the calculated BIP(i) and the received BIP field of the alignment marker(i). If a mismatch is found, the BIP error counter for lane (i) is incremented. Under the conventional process, the logic would then proceed to a block 1010 in which the calculated BIP(i) for each lane is reset.

Under the new mechanism, the logic proceeds from block 1008 to a block 1012 in which a calculation of the number of lanes N with mismatched BIPs is performed. In a decision block 1012 a determination is made to whether N is greater than 1. If it is not, the logic proceeds to a block 1022 in which hi_ber is set to false, and the proceeds to block 1010. Since the default state of hi_ber is false, in one embodiment the logic proceeds directly from decision block 1014 to block 1010.

Figure 11:
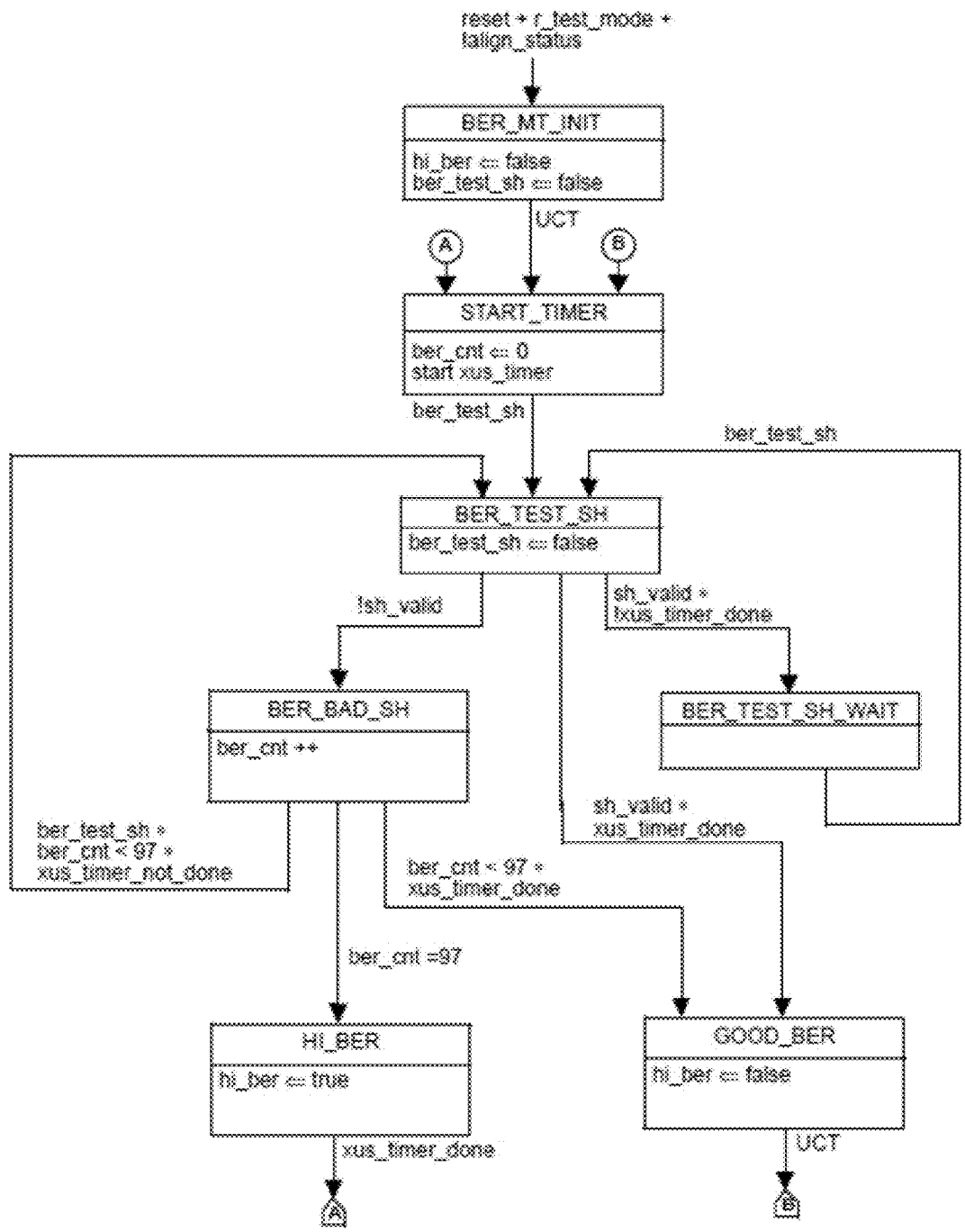
FIG. 11 is a BER monitor state diagram, according to one embodiment.

If N is greater than 0, in one embodiment the logic proceeds to a block 1016 in which the BIP burst counter N is incremented by 1. In one embodiment, a determination is then made in a decision block 1018 to whether the BIP burst length exceeds an alert threshold value. For example, the receiver can alternatively trigger an alert when the burst length is higher than some threshold, e.g., 3 or more errors. In one embodiment, an alert it can assert hi_ber for a given duration (e.g., until the next alignment marker block is received), such as depicted in a block 1020. hi_ber is an existing logic output of the BER monitor function of the PCS, as shown in FIG. 11; this added functionality (asserting hi_ber as an alert) can be OR'ed with the existing hi_ber logic. If the BIP burst length does not exceed the alert threshold, the flowchart logic proceeds to a block 1022 that indicates hi_ber is false, and the logic proceeds to block 1014. Alternatively, the logic may proceed directly from decision block 1018 to block 1010 for embodiments under which hi_ber is not used as an alert. In one embodiment, assertion of hi_ber will cause PCS_status=false and the XGMII set to LOCAL_FAULT until hi_ber is de-asserted back (for a minimum duration of 42 microseconds, the period between alignment markers), temporarily pausing traffic. This information is exposed in an MDIO (Management Data Input/Output) register, both momentarily and latched high. A management entity that monitors the MDIO register will then be informed of the hi_ber condition and determine whether to take additional actions As indicated by the dashed blocks and connectors in FIG. 10, implementation of these blocks may be optional, and different combination may be implemented. For example, in one embodiment the logic proceed directly from block 1016 to block 1010 without evaluating the alert trigger condition in decision block 1018. As another option, the logic for a YES result for decision block 1014 may proceed direction to decision block 1018, skipping incrementing the BIP burst counter by N−1 in block 1016.

As illustrated by the data in TABLE 1, the BIP burst counters may be implemented as reliable indicators of burst frequency and differentiate between uncorrelated error rate and probability of error propagation. Accordingly, they can be used to monitor the link health and even predict MTTFPA.

In further detail, the MTTFPA may be predicted using the following probability analysis. The analysis begins with the assumption that all physical lanes are equally errant. The rate of single errors $f_1$ is measured over time; estimate BER as, $$p_1 = f_1 \cdot UI$$

Where UI is the unit interval, the period over which one bit is transmitted over a physical lane.

The rate of 2-error bursts $f_2$ is also measured over time; the probability of error propagation, $p_2$, is estimated as, $$p_2 = f_2 / f_1 \cdot UI$$

The estimated p(burst≥4) is then, $$p_1 \cdot p_2^3$$

Assuming maximum-length Ethernet frames, The estimated MTTFPA can be calculated as, $$\frac{\cdot 2^{32}}{p(\text{burst} \geq 4)} \frac{UI}{4} \cong \frac{1.4 \cdot 10^{-9}}{p(\text{burst} \geq 4)} \text{years}$$

As an example, if all four lanes have BER=1e−15 and p(EP)=0.03, the projected MTTFPA≈13 billion years.

How fast can MTTFPA be estimated? Consider a CAUI-4 link that operates under worst-case compliant conditions (stated above). An estimation of how fast the counters advance for this system is performed, and a comparison to cases when either its BER or its p(EP) are increased is made. The results shown in TABLE 1 below demonstrate that unsafe conditions are likely to be detected within a few days of operation.

TABLE 1 summarizes statistical analysis results of a system that operates at the expected worst-case compliant performance (uncorrelated BER=1e−15 and error propagation probability of 0.03, leading to MTTFPA of 14 billion years), and two possible degraded versions of that system.

TABLE 1

| Scenario | BER = 1e−15, p(EP) = 0.03 | BER = 1e−14, p(EP) = 0.03 | BER = 1e−15, p(EP) = 0.3 |
|---|---|---|---|
| MTTFPA | 13 billion years | 1.3 billion years | 13 million years |
| Mean time to a single error (any BIP mismatch) | 2.7 hours | 16 minutes | 2.7 hours |
| Mean time to burst of length 2 | 3.7 days | 9 hours | 9 hours |
| Mean time to burst of length 3 | 125 days | 12 days | 30 hours |
| Mean time to burst of length 4 | 380 years | 38 years | 14 days |
| Mean time to 2 uncorrelated errors in same period (false count) | 6000 years | 60 years | 6000 years |

Under links such as 100GBASE-LR4 and 100GBASE-ER4, asserting hi_ber will be reflected in a "receive fault" bit in the PCS status register, which has a latched-high logic (see subclause 45.2.3.7.3). By configuring a management or monitoring function to detect the PCS status register, the assertion of hi_ber can be used to inform a network management entity or the like that the link is operating in an errant condition, and appropriate measures can be performed in response to detection of such a condition.

Figure 12:
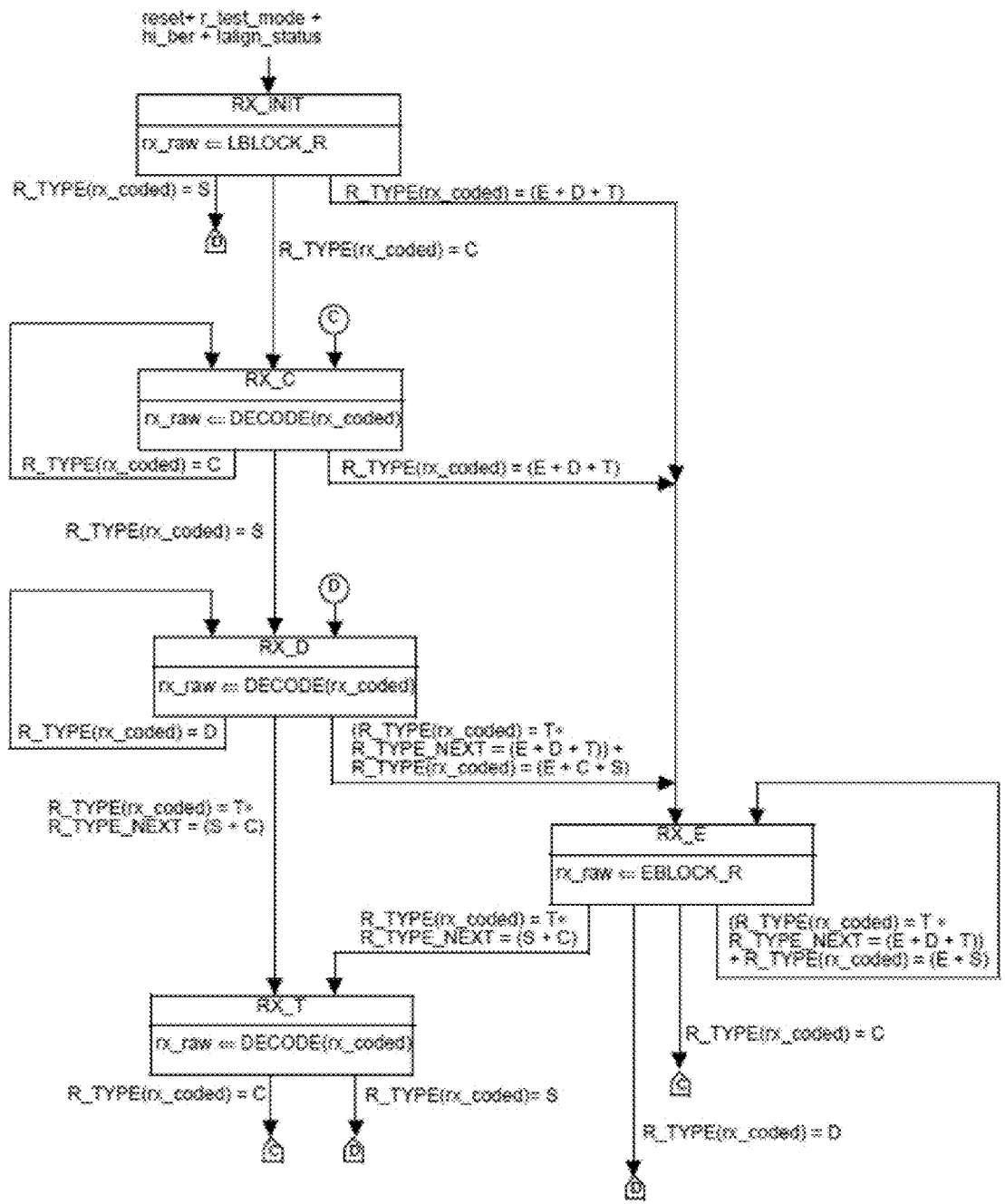
FIG. 12 is a receive state diagram, according to one embodiment.

As discussed above, in one embodiment, asserting hi_ber will also send LOCAL_FAULT on its client interface instead of whatever data it decoded, causing a temporary pause of the receive process. This is shown in the RX_INIT state of the receive state diagram shown in FIG. 12. LBLOCK_R means "local fault" on the receive interface.

Note that as shown above, the mean time to a 3-error burst event, assuming worst-case conditions, is about 125 days. An alert once in 125 days may not be desirable; but under slightly improved operating conditions, both BER and error propagation probability are considerably reduced, and can result in mean time to alert of several years. This alert may not be required if the burst error counters are implemented, as network management can monitor both registers in the same way.

Figure 13:
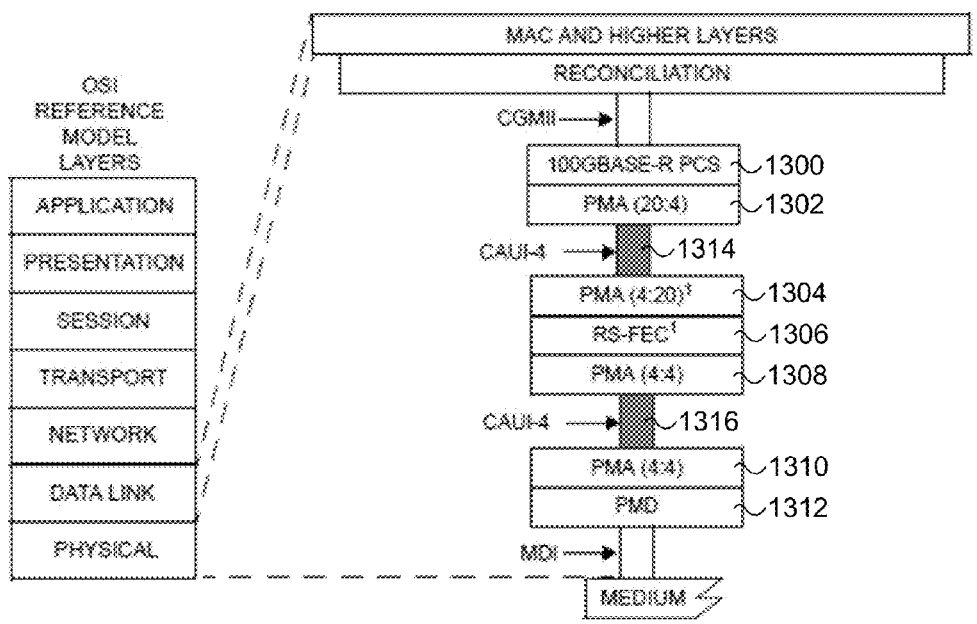
FIG. 13 is a diagram illustrating the CAUI-4 link relationship relative to the ISO/IEC Open System Interconnection reference model and the IEEE 802.3 LAN CSMA/CD LAN model.

Also, as discussed above, the use of CAUI-4 interfaces is contemplated for use in proposed 100 Gb/s links. FIG. 13 illustrates the CAUI-4 relationship to the ISO/IEC Open System Interconnection reference model and the IEEE 802.3 CSMA/CD LAN model. As shown in the reference model, the PHY sublayers include a 100GBASE-R PCS sublayer 1300, a PMA sublayer 1302, a PMA sublayer 1304, an RS-FEC sublayer 1306, PMA sublayers 1308 and 1310, and a PMD sublayer 1312. A first CAUI-4 link 1314 and associated CAUI-4 interfaces are used to interconnect PMA sublayers 1302 and 1304. A second CAUI-4 link 1316 and associated CAUI-4 interfaces are used to interconnect PMA sublayers 1308 and 1310. As described below, there are other PHY configurations in addition to that shown in FIG. 13 that may employ a single CAUI-4 link and interfaces.

Figure 14:
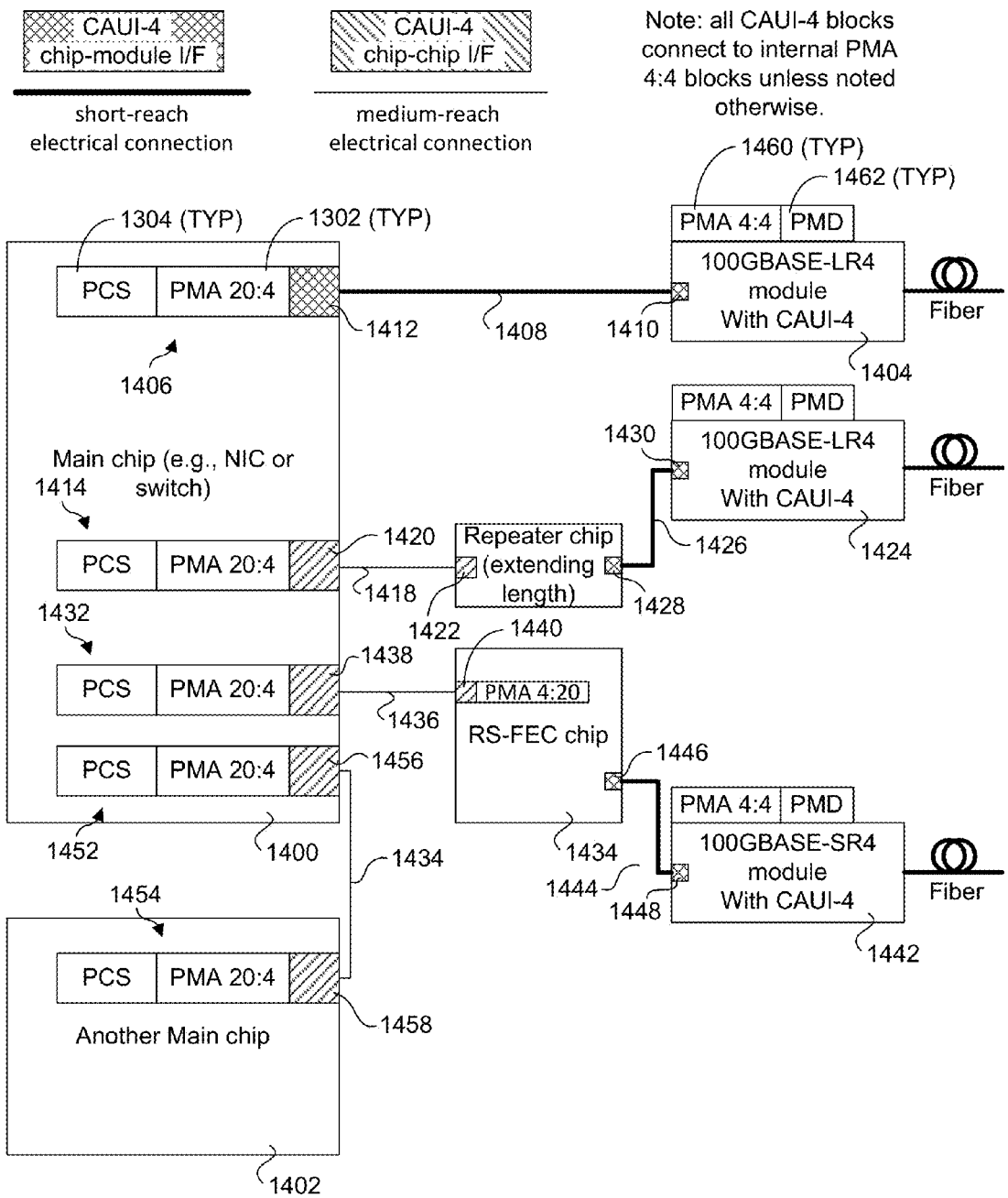
FIG. 14 is a schematic diagram illustrating various use cases for CAUI-4 links.

FIG. 14 illustrates some exemplary use cases for CAUI-4 links. CAUI-4 links may be used for either chip-to-chip or chip-to-module links. For illustrative purposes and without limitation, chip-to-module CAUI-4 links are depicted as short-reach electrical connections, while chip-to-chip CAUI-4 links are depicted as medium-reach electrical connection; it shall be recognized that chip-to-chip and chip-to-module CAUI-4 links may have various reaches and other electrical properties depending on application.

FIG. 14 shows a first main chip 1400 and a second main chip 1402. Examples of main chips include but are not limited to a Network Interface Controller (NIC) chip or a switch chip. Each main chip includes one or more instances of 100 Gb/s higher PHY PCS sublayers 1300 and PMA sublayers 1302; each set of these sublayers correspond to a logic PHY component instance under which the PHY layers are distributed across multiple physical components, as illustrated. In the uppermost example, a 100GBASE-LR4 module 1404 is connected to a set of PHY upper sublayers 1406 via a CAUI-4 link 1408 and respective CAUI-4 interfaces 1410 and 1412. A next set of PHY upper sublayers 1414 is connected to a repeater chip 1416 via a CAUI-4 link 1418 and respective CAUI-4 interfaces 1420 and 1422. The opposite side of repeater chip 1416 is connected to a 100GBASE-LR4 module 1424 via a CAUI-4 link 1426 and respective CAUI-4 interfaces 1428 and 1430.

In another exemplary use case, a set of PHY upper sublayers 1414 is connected to an RS-FEC chip 1434 via a CAUI-4 link 1436 and respective CAUI-4 interfaces 1438 and 1440. The opposite side of RS-FEC chip 1434 is connected to a 100 GBASE-SR4 module 1442 via a CAUI-4 link 1444 and respective CAUI-4 interfaces 1446 and 1448.

There may also be use cases where a CAUI-4 link and associated interfaces are used to couple PHY upper sublayer instances in respective main chips, as depicted by a CAUI-4 link 1450 coupled between respective PHY upper sublayers 1452 and 1454 on main chips 1400 and 1402 via CAUI-4 interfaces 1456 and 1458. Also, each of 100GBASE-LR4 modules 1404 and 1424 and 100GBASE-SR4 module 1442 is further depicted as including a PMA sublayer 1310 and PMD sublayer 1312. In addition to the illustrated examples, other combinations of chips (main, repeater, RS-FEC, etc.) and modules may also be implemented.

Figure 15A:
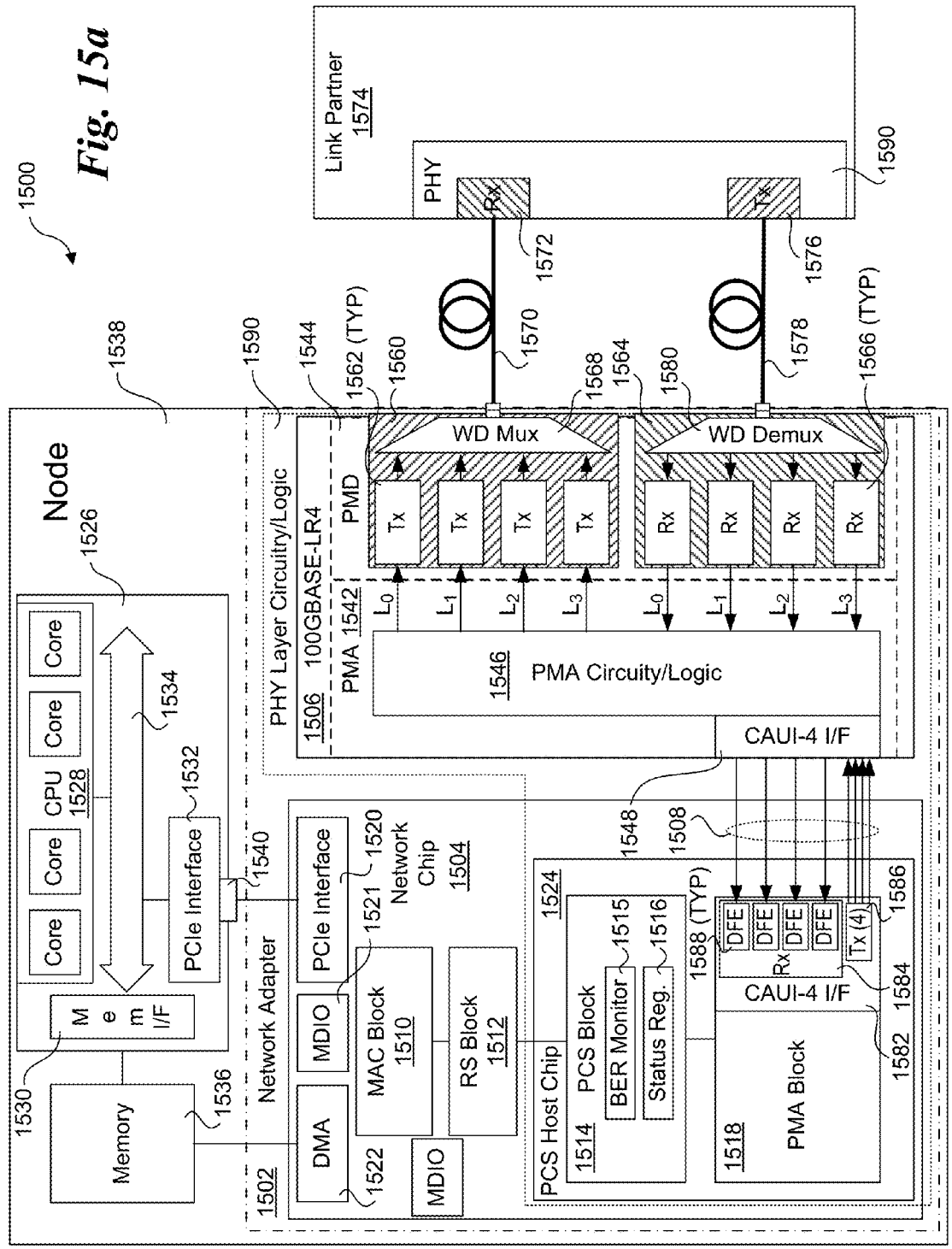
FIG. 15a is a schematic diagram illustrating an architecture for a network node configured to implement prevention of false packet acceptance in accordance with embodiments disclosed herein.

FIG. 15a shows an exemplary architecture for a network node 1500 configured to prevent false packet acceptance in accordance with aspects of the embodiments disclosed herein. The network node 1500 includes a network adaptor 1502 comprising a network chip 1504 coupled to a 100GBASE-LR4 module 1506 via a CAUI-4 link 1508. In further detail network chip 1504 includes a MAC block 1510, a Reconciliation Sublayer (RS) block 1512, a PCS block 1514 including a BER monitor 1515 and a status register 1516 and a PMA block 1518. In the illustrated embodiment, network chip 1504 further includes a PCIe interface 1520, and MDIO register 5021, and a Direct Memory Access (DMA) engine 1522. In some embodiments, the components and blocks depicted in the box for network chip 1506 may be implemented as two or more discrete components, such as depicted by a PCS host chip 1524 that includes PCS block 1514 and PMA block 1518.

Network node 1500 also comprises a System on a Chip (SoC) 1526 including a Central Processing Unit (CPU) 1528 having one or more processor cores, coupled to a memory interface 1530 and a PCIe interface 1532 via an interconnect 1534. Memory interface 1530 is further depicted as being coupled to memory 1536. Under a typical configuration, network chip 1506, SoC 1526 and memory 1536 will be mounted on or otherwise operatively coupled to a circuit board 1538 that includes wiring traces for coupling these components in communication, as depicted by single lines connecting DMA 1522 to memory 1536 and PCIe interface 1520 to PCIe interface 1532 at a PCIe port 1540.

100GBASE-LR4 module 1506 includes a PMA block 1542 and a PMD block 1544. PMA block 1542 includes PMA circuitry and logic 1546 and a CAUI-4 interface (I/F) 1548. PMD block 1544 is configured to implement a physical media dependent interface, which in this instance is an optical interface including an optical transmit port 1560 comprising four optical transmitters 1562, and an optical receive port 1564 comprising four optical receivers 1566. Optical transmitter output optical signals at different respective wavelengths that are combined as a multiplexed optical signal via a Wavelength Division (WD) multiplexer (mux) 1568, transmitted via an optical fiber 1570 to a receiver port 1572 on a link partner 1574. A similarly configured transmitter port 1576 transmits a multiplexed optical signal via an optical fiber 1578 back to receiver port 1564, where it is received at a WD demultiplexer (demux), which divides the received optical signal into its respective wavelengths and provides these divided signals to respective optical receivers 1566.

Further details of one embodiment of a CAUI-4 interface 1582 is shown coupled to PMA block 1518. A CAUI-4 interface and associated link employs 4 transmit and 4 receive lanes, and supports a transmission rate of 25 Gbaud on each lane, collectively providing a 100 Gb/s link. Signals on the four receive lanes are received at a receive port 1584, and the four transmit lanes are output from a transmit port 1586. In the illustrated embodiment, receive port 1584 includes four DFEs 1588, one for each respective receive lane. Generally, a CAUI-4 interface may or not employ DFEs on its receive lanes, depending on the particular implementation.

Many of the blocks depicted for network adaptor 1502 comprise circuitry and logic configured to effect corresponding layer or sublayer operations associated with reference models herein. For example, network adaptor 1502 includes blocks that are configured to map to respective layers and sublayers of the 100GBASE-LR4 reference model shown in FIG. 1. Under this reference model, MAC block 1420 and RS block 1422 are respectively configured to implement aspects of the MAC layer and reconciliation sub-layer operations defined for a 100GBASE-LR4 link. Similarly, PCS block 1514 comprises circuitry and logic configured to implement PCS sublayer operations, PMA blocks 1518 and 1542 comprise circuitry and logic configured to implement PMA sublayer operations, and PMD block 1544 comprises circuitry and logic configured to implement PMD sublayer operations.

As depicted by a small-dashed outline labeled PHY layer circuitry/logic 1590, the combined circuitry and logic depicted within the outline is configured to implement the PHY layer operations for a 100GBASE-LR4 link. For ease of explanation and understanding, the various PHY sublayer operations are shown as being implemented by separate blocks. However, it will be understood that the circuitry and logic for implemented the PHY layer operations may comprise more or less blocks than that depicted, and it will be recognized by those having skill in the art that the illustrated blocks may be considered to depict logical separation of sublayer operations. At the same time, a given block may comprise an IP (Intellectual Property) block or module that is configured by integrated with other IP blocks to implement the PHY operations.

Generally, 100GBASE-LR4 module 1506 will comprise a physically separate, self-contained module configured to implement PMA and PMD sublayer operations for a 100GBASE-LR4 link. In one embodiment, network adapter 1512 comprises a printed circuit board (PCB) (or a portion of a PCB on which SoC 1526 is mounted), and 100GBASE-LR4 module 1506 comprises a module mounted on the PCB. In one embodiment of this configuration, CAUI-4 link 1508 comprises wiring traces in the PCB that are coupled between CAUI-4 interface 1548 on 100GBASE-LR4 module 1506 and CAUI-4 interface 1582, which may comprise an interface on network chip 1504 or PCS host chip 1524. Under another configuration, network adaptor 1502 comprises a multi-chip module including a 100GBASE-LR4 module 1506 coupled to one or more additional chips. Under this configuration, CAUI-4 link 1508 comprises interconnect circuitry coupling signals from 100GBASE-LR4 module 1506 to a chip or another module.

As will be recognized by those skilled in the art, a network adapter will generally include additional components, circuitry and logic to that shown; this elements are not shown in FIG. 15a for simplicity and clarity so as to not obscure the aspects of the embodiments disclosed herein. For example, a network adaptor may include various buffers for storing received and to-be-transmitted packets, and a network adaptor may further include one or more processors, controllers, etc., that are configured to perform packet-processing operations, such as but not limited to packet classification, RDMA (remote direct memory access), upper layer packet handling (e.g., TCP/IP network stack operations), and other operation.

Figure 15B:
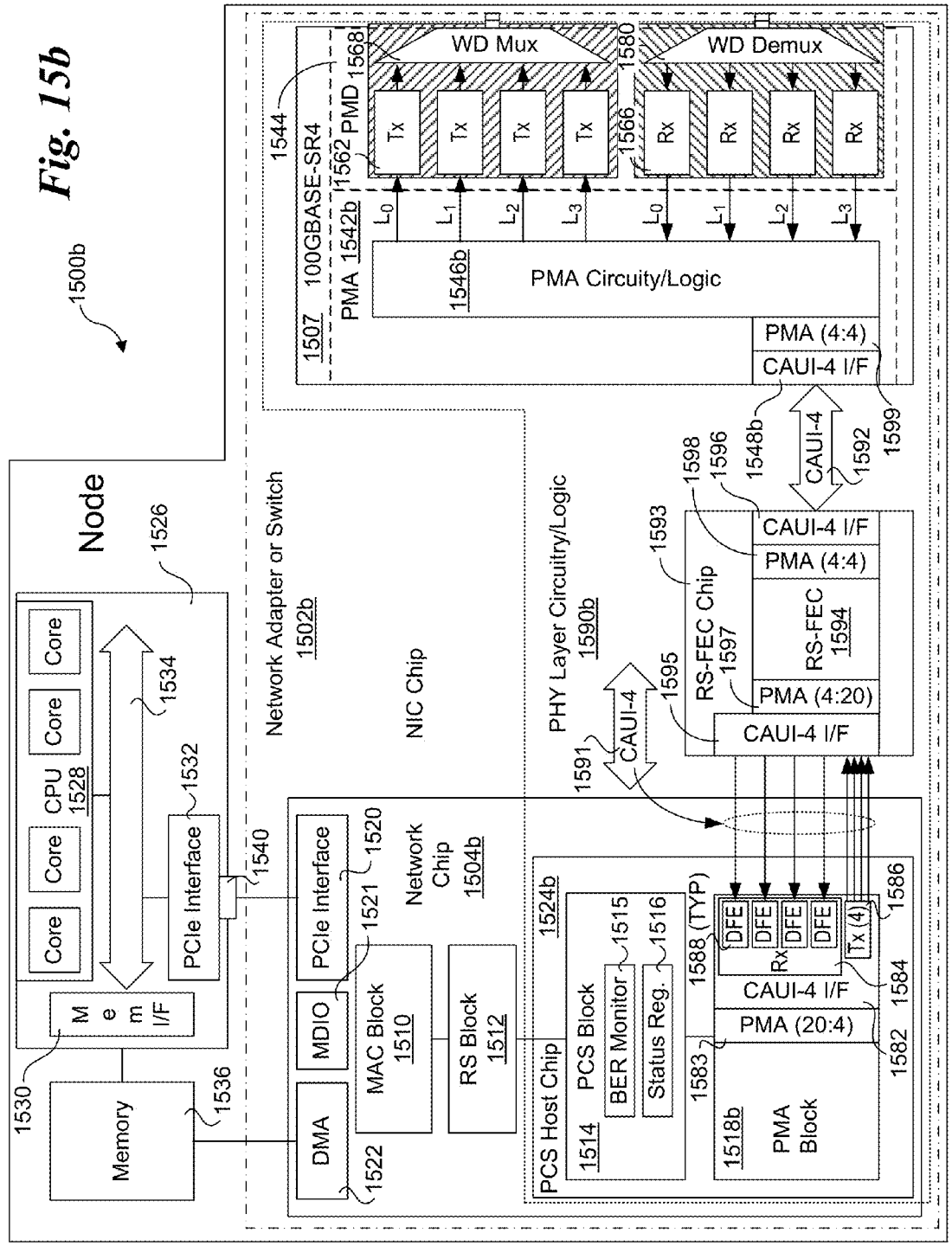
FIG. 15b is a schematic diagram illustrating modifications to the network node architecture of FIG. 15a, including the use of two CAUI-4 links and an RS-FEC chip.

FIG. 15b shows a network node 1500b including a network adapter or switch 1502b having PHY layer circuitry/logic 1590b comprising a variation of PHY layer circuitry/logic 1590 of FIG. 15a. Generally, like-numbered elements in FIGS. 15a and 15b perform similar operations; accordingly, the following discussion of network node 1500b will focus on the differences between the two configurations.

In accordance with one aspect, the architecture for PHY layer circuitry/logic 1590b is associated with the CAUI-4 reference model shown in FIG. 13, and includes a pair of CAUI-4 links 1591 and 1592. These CAUI-4 links are coupled on opposing sides of a RS-FEC chip 1593 including an RS-FEC block 1594 that is configured to perform Reed-Solomon Forward Error Correction operations. RS-FEC chip 1593 includes CAUI-4 interfaces 1595 and 1596 and PMA subblocks 1597 and 1598. Network node 1500b includes a 100GBASE-SR4 module 1507 including a PMD block 1544 having a similar configuration to PMD block 1544 of 100GBASE-LR4 module 1506 and a PMA block 1542b including PMA circuitry/logic 1546b, a PMA subblock 1599, and a CAUI-4 interface 1548b. PMA block 1518b is similar to PMA block 1518, but further adds a PMA subblock 1583. As depicted, the circuitry and logic for PCS block 1514b, PMA block 1518b, PMA subblock 1583 and CAUI-4 interface 1582 may be implemented on a PCS host chip 1524b or may be part of a network chip 1504b.

Figure 16:
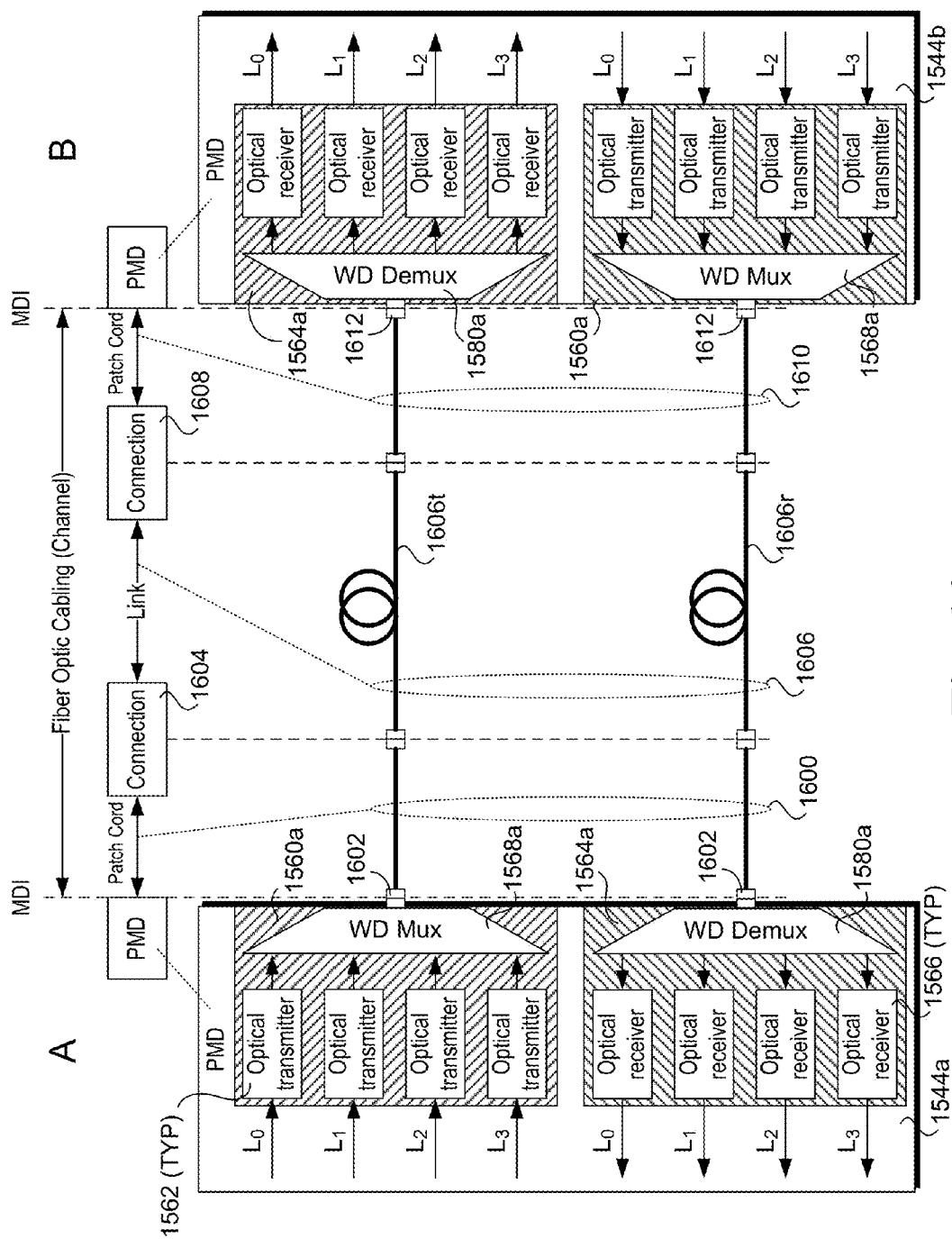
FIG. 16 is a schematic diagram illustrating an embodiment of a fiber optic cabling configuration used to facilitate transmission of data between a pair of link partners.

FIG. 16 shows further details of one configuration of fiber optic cabling used to transmit data between two link partners A and B. For simplicity, only PMD blocks 1544a and 1544b of the link partners are shown, with the understanding that each link partner would be configured similar to one of the embodiments depicted in FIG. 15a or 15b and as discussed above. A patch chord 1600 is coupled at one end to an optical connector 1602 at the output of WD mux 1568a of transmitter port 1560a and to one side of an optical connection 1604 at the other end. A section of fiber cable 1606t is coupled between the other end of optical connection 1604 and a second optical connection 1608, which in turn is connected to a second patch cord 1610 that is connected to an optical connector 1612 coupled to the WD demux 1580a at receiver port 1564a of link PMD block 1544b of link partner B. A similar configuration is used for transmitting data from the transmitter port 1560b of PMD block 1544b to the receive port 1564a of PMD block 1544a, except in this instance the section of fiber cable is labeled 1606r. In practice, fiber cable sections 1606t and 1606r are physically coupled together to form a bidirectional fiber cable section 1606 comprising two sections of multimode fiber, each for transmitting multiple wavelengths of data in opposite directions.

In general, the circuitry and components of depicted for network chips 1504 and 1504b may also be implemented in other types of chips and components, including SoCs, multichip modules, and networking interface chips including support for multiple network interfaces (e.g., wired and wireless). For example, and without limitation, in one embodiment one or more of network chips 1504 and 1504b comprise an SoC and includes one or more of a processor having one or more cores, a network processor having one or more cores/engines, memory buffers, and upper layer packet handling logic.

In addition, aspects of embodiments of the present description may be implemented not only within a semiconductor chips such as network chips and SoCs, but also within non-transient machine-readable media. For example, the designs described above may be stored upon and/or embedded within non-transient machine readable media associated with a design tool used for designing semiconductor devices. Examples include a netlist formatted in the VHSIC Hardware Description Language (VHDL) language, Verilog language or SPICE language, or other Hardware Description Language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

In addition to use for high-speed Ethernet links, aspects of the embodiments disclosed herein may be implemented in other types of high-speed links, such as but not limited to wired links and InfiniBand® links. Similarly, the teachings and principles disclosed herein may be applied to both existing and future high-speed links.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, circuitry and logic to effect various operations, such as the PHY sublayer operations described herein may be implemented via one or more of embedded logic, embedded processors, controllers, microengines, or otherwise using any combination of hardware, software, and/or firmware. For example, sublayer operations may be effected using programmed logic gates and the like, including but not limited to ASICs, FPGAs, IP block libraries, or through one or more of software or firmware executed by on one or more processing elements including processors, processor cores, controllers, microcontrollers, microengines, etc.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for detecting errant link operating conditions in a link comprising a plurality of physical lanes over which data is transmitted and received using a plurality of virtual lanes, comprising:
    receiving data via the plurality of physical lanes as a plurality of data streams, the data corresponding to a plurality of MAC (Media Access Channel) frames employing a cyclic redundancy check;
    multiplexing data corresponding each data stream onto a first plurality of virtual lanes;
    processing data received via each of the first plurality of virtual lanes and detecting errors in the received data on a virtual lane-by-lane basis;
    generating error indications indicating one or more errors has been detected on at least one virtual lane;
    employing the error indications to detect error burst events comprising a burst of errors in the data received over the link;
    detecting an errant link operating condition based on a detected error burst event; and in response to detection of the errant link operating condition,
    at least one of pausing and restarting the link to reduce the probability of false packet acceptance of a MAC frame employing the cyclic redundancy check.

2. The method of claim 1, wherein data is transferred over the link in a data unit containing original data that is serialized into the plurality of data streams and received via the plurality of physical lanes and are demultiplexed over the plurality of virtual lanes to process the data including detection errors in the data, and wherein after the data on the virtual lanes is processed the data are multiplexed and deserialized to recover the original data, and wherein the errors that are detected correspond to a burst of errors on one or more physical lanes that result in non-contiguous errors in the recovered original data.

3. The method of claim 1, wherein the received data includes data that was generated by a Physical Coding Sublayer (PCS) block and includes alignment markers that were periodically inserted into transmitted data, each alignment marker including a bit-interleaved parity (BIP) field containing a calculated BIP value for each of a second plurality of virtual lanes, each virtual lane of the second plurality of virtual lanes corresponding to a respect virtual lane in the first plurality of virtual lanes, and wherein the method further comprises:
    for each virtual lane of the first plurality of virtual lanes, re-calculating the BIP value for the data received via that virtual lane;
    comparing, for each pair of corresponding virtual lanes in the first and second plurality of virtual lanes, the BIP value in the transmitted data with the re-calculated BIP value for the received data; and
    for each virtual lane in the first plurality of virtual lanes for which the re-calculated BIP value does not match the BIP value in the transmitted data of its corresponding virtual lane in the second plurality of virtual lanes, generating indicia associated with that virtual lane to indicate there is a BIP mismatch.

4. The method of claim 1, further comprising:
    implementing a plurality of burst length counters, each storing a count of an occurrence of a respective error burst length;
    detecting mismatched bit-interleaved parity (BIP) values in data on the virtual lanes;
    counting the lanes with mismatched BIP values to calculate an error burst length; and
    incrementing the burst length counter corresponding to the error burst length that is calculated.

5. The method of claim 4, further comprising:
    exposing at least a portion of the burst length counter data via a management data interface.

6. The method of claim 1, further comprising:
    detecting that a burst length has exceeded a threshold; and, in response thereto, asserting a hi_ber condition.

7. The method of claim 6, wherein in response to the hi_ber condition the link is at least one of paused or restarted, and wherein the predetermined threshold is determined using a statistical model such that the frequency of the hi_ber condition is sufficiently low if the mean time to false packet acceptance (MTTFPA) exceeds a predetermined value.

8. The method of claim 1, wherein the link comprises a 100 Gb/s Attachment Unit Interface (CAUI-4) interconnect comprising four physical lanes.

9. The method of claim 1, wherein there are four physical lanes and 20 virtual lanes.

10. An apparatus comprising:
    a receive port including receiver circuitry for four receive lanes, configured to receive a respective bit stream of data on each receive lane;
    a Physical Media Attachment (PMA) block operatively coupled to the receive port comprising circuitry and logic to effect PMA sublayer operations on data received from the receive port via the respective bit streams, including demultiplex data corresponding to each respective bit stream into a plurality of virtual lanes;
    a first Physical Coding Sublayer (PCS) block, operatively coupled to the PMA block, comprising circuitry and logic to effect PCS sublayer operations on data received from the PMA block including,
process data received from the PMA block via the plurality of virtual lanes and detecting errors in the received data on a virtual lane-by-lane basis;
generate error indications indicating one or more errors has been detected on at least one virtual lane; and
employ the error indications to detect error burst events comprising a burst of errors in the data received at the receive port.

11. The apparatus of claim 10, wherein the four lanes of the receive port are configured to be coupled to a link comprising four physical lanes over which data is transferred in a data unit containing original data that is serialized into the plurality of data streams and received via the plurality of physical lanes and are demultiplexed over the plurality of virtual lanes to process the data, the processing including detecting errors in the data, and wherein after the data on the virtual lanes is processed the data are multiplexed and deserialized to recover the original data, and wherein the errors that are detected correspond to a burst of errors received on one or more physical lanes that result in non-contiguous errors in the recovered original data.

12. The apparatus of claim 10, wherein the receive port comprises the receive port of a 100 Gb/s Attachment Unit Interface (CAUI-4) interface, further comprising a CAUI-4 transmit port.

13. The apparatus of claim 12, wherein the receive port further comprises a respective decision feedback equalizer (DFE) for each of the four receive lanes.

14. The apparatus of claim 10, wherein the received data includes data that was generated by a second Physical Coding Sublayer (PCS) block and includes alignment markers that were periodically inserted into transmitted data, each alignment marker including a bit-interleaved parity (BIP) field containing a calculated BIP value for each of a second plurality of virtual lanes, each virtual lane of the second plurality of virtual lanes corresponding to a respect virtual lane in the first plurality of virtual lanes, and wherein the circuitry and logic in the first PCS block is further configured to:
for each virtual lane of the first plurality of virtual lanes, re-calculate the BIP value for the data received via that virtual lane;
compare, for each pair of corresponding virtual lanes in the first and second plurality of virtual lanes, the BIP value in the transmitted data with the re-calculated BIP value for the received data; and
for each virtual lane in the first plurality of virtual lanes for which the re-calculated BIP value does not match the BIP value in the transmitted data of its corresponding virtual lane in the second plurality of virtual lanes, generating indicia associated with that virtual lane to indicate there is a BIP mismatch.

15. The apparatus of claim 10, wherein circuitry and logic in the first PCS block is further configured to:
implement a plurality of burst length counters, each storing a count of an occurrence of a respective error burst length;
detect mismatched bit-interleaved parity (BIP) values in data on the virtual lanes;
count the lanes with mismatched BIP values to calculate an error burst length; and
increment the burst length counter corresponding to the error burst length that is calculated.

16. The apparatus of claim 15, further comprising a management data interface, wherein the apparatus is further configured to enable access to at least a portion of the burst length counter data via the management data interface.

17. The apparatus of claim 10, wherein the circuitry and logic in the first PSC block is further configured to detect that a burst length has exceeded a threshold, and in response thereto, assert a hi_ber condition.

18. An apparatus comprising:
a chip including,
a first 100 Gb/s Attachment Unit Interface (CAUI-4) interface comprising a receive port including receiver circuitry for four receive lanes and a transmit port including transmitter circuitry for four transmit lanes;
a first Physical Media Attachment (PMA) block operatively coupled to the CAUI-4 interface comprising circuitry and logic configured to effect PMA sublayer operations on data received from the first CAUI-4 interface;
a first Physical Coding Sublayer (PCS) block, operatively coupled to the first PMA block, comprising circuitry and logic configured to effect PCS sublayer operations on data received from the first PMA block, the data being received from the first PMA block as four respective bit streams; and
an optical module, including,
a plurality of optical transmitters, coupled to a wavelength division multiplexer;
a plurality of optical receivers, coupled to a wavelength division demultiplexer;
a second PMA block operatively coupled to the plurality of optical transmitters and optical receivers, comprising circuitry and logic configured to effect PMA sublayer operations relating to signals sent to the optical transmitters and signals received from the optical transmitters;
a second CAUI-4 interface operatively coupled to the second PMA block and comprising a receive port including receiver circuitry for four receive lanes and a transmit port including transmitter circuitry for four transmit lanes; and
CAUI-4 interconnect wiring coupled between the first and second CAUI-4 interfaces,
wherein the circuitry and logic in the first PMA block and the first PCS block is configured to,
demultiplex data corresponding to each respective bit stream received from the from the first CAUI-4 interface into a plurality of virtual lanes;
process data on each of the plurality of virtual lanes and detect errors in the data on a virtual lane-by-lane basis;
generate error indications indicating one or more errors has been detected on at least one virtual lane; and
employ the error indications to detect error burst events comprising a burst of errors in the data received at the receive port.

19. The apparatus of claim 18, wherein the receive port of the first CAUL-4 interface further comprises a respective decision feedback equalizer (DFE) for each of the four receive lanes.

20. The apparatus of claim 18, wherein the received data includes data that was generated by a second Physical Code Sublayer (PCS) block and includes alignment markers that were periodically inserted into transmitted data, each alignment marker including a bit-interleaved parity (BIP) field containing a calculated BIP value for each of a second plurality of virtual lanes, each virtual lane of the second plurality of virtual lanes corresponding to a respect virtual lane in the first plurality of virtual lanes, and wherein the circuitry and logic in the first PCS block is further configured to:
  for each virtual lane of the first plurality of virtual lanes, re-calculate the BIP value for the data received via that virtual lane;
  compare, for each pair of corresponding virtual lanes in the first and second plurality of virtual lanes, the BIP value in the transmitted data with the re-calculated BIP value for the received data; and
  for each virtual lane in the first plurality of virtual lanes for which the re-calculated BIP value does not match the BIP value in the transmitted data of its corresponding virtual lane in the second plurality of virtual lanes, generating indicia associated with that virtual lane to indicate there is a BIP mismatch.

21. The apparatus of claim 18, wherein circuitry and logic in the first PCS block is further configured to:
  implement a plurality of burst length counters, each storing a count of an occurrence of a respective error burst length;
  detect mismatched bit-interleaved parity (BIP) values in data on the virtual lanes;
  count the lanes with mismatched BIP values to calculate an error burst length; and
  increment the burst length counter corresponding to the error burst length that is calculated.

22. The apparatus of claim 18, wherein the circuitry and logic in the first PCS block is further configured to detect that a burst length has exceeded a threshold, and in response thereto, assert a hi_ber condition.

23. The apparatus of claim 18, wherein the optical module comprises one of a 100GBASE-LR4 module or a 100GBASE SR4 module.

24. An apparatus comprising:
  a first chip including,
    a first 100 Gb/s Attachment Unit Interface (CAUI-4) interface comprising a receive port including receiver circuitry for four receive lanes and a transmit port including transmitter circuitry for four transmit lanes;
    a first Physical Media Attachment (PMA) block operatively coupled to the CAUI-4 interface comprising circuitry and logic configured to effect PMA sublayer operations on data received from the first CAUI-4 interface;
    a first Physical Coding Sublayer (PCS) block, operatively coupled to the first PMA block, comprising circuitry and logic configured to effect PCS sublayer operations on data received from the first PMA block, the data being received from the first PMA block as four respective bit streams;
  a second chip comprising an RS-FEC (Reed Solomon-Forward Error Correction) chip including,
    an RS-FEC block including circuitry and logic for implementing RS-FEC sublayer operations;
    second and third PMA blocks operationally coupled to the RS-FEC block, each configured to effect PMA sublayer operations; and
    second and third CAUI-4 interfaces, respectively coupled to the second and third PMA blocks, each of the CAUI-4 interfaces comprising a receive port including receiver circuitry for four receive lanes and a transmit port including transmitter circuitry for four transmit lanes; and
  an optical module, including,
    a plurality of optical transmitters, coupled to a wavelength division multiplexer;
    a plurality of optical receivers, coupled to a wavelength division demultiplexer;
    a fourth PMA block operatively coupled to the plurality of optical transmitters and optical receivers, comprising circuitry and logic configured to effect PMA sublayer operations relating to signals sent to the optical transmitters and signals received from the optical transmitters; and
    a fourth CAUI-4 interface operatively coupled to the fourth PMA block and comprising a receive port including receiver circuitry for four receive lanes and a transmit port including transmitter circuitry for four transmit lanes; and
  a first CAUI-4 interconnect coupled between the first and second CAUI-4 interfaces;
  a second CAUI-4 interconnect coupled between the third and fourth CAUI-4 interfaces;
  wherein the circuitry and logic in the first PMA block and the first PCS block is configured to,
    demultiplex data corresponding to each respective bit stream received from the from the first CAUI-4 interface into a plurality of virtual lanes;
    process data on each of the plurality of virtual lanes and detecting errors in the data on a virtual lane-by-lane basis;
    generate error indications indicating one or more errors has been detected on at least one virtual lane; and
    employ the error indications to detect error burst events comprising a burst of errors in the data received at the receive port.

25. The apparatus of claim 24, wherein the receive port of the first CAUI-4 interface further comprises a respective decision feedback equalizer (DFE) for each of the four receive lanes.

26. The apparatus of claim 24, wherein the received data includes data that was generated by a second Physical Coding Sublayer (PCS) block and includes alignment markers that were periodically inserted into transmitted data, each alignment marker including a bit-interleaved parity (BIP) field containing a calculated BIP value for each of a second plurality of virtual lanes, each virtual lane of the second plurality of virtual lanes corresponding to a respect virtual lane in the first plurality of virtual lanes, and wherein the circuitry and logic in the first PCS block is further configured to:
  for each virtual lane of the first plurality of virtual lanes, re-calculate the BIP value for the data received via that virtual lane;
  compare, for each pair of corresponding virtual lanes in the first and second plurality of virtual lanes, the BIP value in the transmitted data with the re-calculated BIP value for the received data; and
  for each virtual lane in the first plurality of virtual lanes for which the re-calculated BIP value does not match the BIP value in the transmitted data of its corresponding virtual lane in the second plurality of virtual lanes, generating indicia associated with that virtual lane to indicate there is a BIP mismatch.

27. The apparatus of claim 24, wherein circuitry and logic in the first PCS block is further configured to:
  implement a plurality of burst length counters, each storing a count of an occurrence of a respective error burst length;
  detect mismatched bit-interleaved parity (BIP) values in data on the virtual lanes;
  count the lanes with mismatched BIP values to calculate an error burst length; and increment the burst length counter corresponding to the error burst length that is calculated.

28. The apparatus of claim 24, wherein the circuitry and logic in the first PCS block is further configured to detect that a burst length has exceeded a threshold, and in response thereto, assert a hi_ber condition.

29. The apparatus of claim 24, wherein the optical module comprises one of a 100GBASE-LR4 module or a 100GBASE SR4 module.

* * * * *